Sept. 12, 1967 A. KÄCH 3,341,714

VARACTOR DIODE FREQUENCY MULTIPLIER

Filed Feb. 17, 1964 2 Sheets-Sheet 1

INVENTOR.
ALFRED KÄCH

BY [signature]

ATTORNEY

INVENTOR.
ALFRED KÄCH
BY
[signature]
ATTORNEY

United States Patent Office 3,341,714
Patented Sept. 12, 1967

3,341,714

VARACTOR DIODE FREQUENCY MULTIPLIER

Alfred Käch, Nussbaumen, Switzerland, assignor to "Patelhold" Patentverwertungs- & Elektro-Holding A.G., Glarus, Switzerland Filed Feb. 17, 1964, Ser. No. 345,361
Claims priority, application Switzerland, Feb. 22, 1963, 2,276/63
12 Claims. (Cl. 307—88.5)

The present invention relates to frequency multipliers utilizing a voltage-responsive capacitor for the distortion of a fundamental frequency wave and segregation of a desired harmonic component from the distorted wave by means of filtering circuits.

There are already known frequency multipliers or harmonic generators of the type utilizing a P–N junction capacitor, also known as a varactor diode, for the distortion of a fundamental frequency to be multiplied. Such a junction diode capacitor is operated within the current-blocking region of the diode and possesses the property of its capacitance depending upon the bias voltage by virtue of the variation of the width of the so-called depletion layer at the junction between the P and N semiconductor regions. The control or operating range and, in turn, the range of capacitance variation are determined by the width of the current-blocking region of the resistive diode operating characteristic. In commercially available varactor diodes the blocking region may extend from about 0.2 to 120 volts, depending upon the type of diode used, whereby to result in a useful capacitance variation by a factor of about 4–12. If an alternating current voltage is superimposed upon the direct current biasing or blocking voltage, the diode capacitance varies about the operating point in a practically inertialess manner and at the rate of the impressed frequency which may be as high or higher than the upper microwave range.

The voltage-dependent capacitance variation of a varactor diode fed by an alternating current voltage has as its result the generation of well defined harmonic frequency components of the fundamental frequency. Inasmuch as the reactive impedance is free from losses, substantially higher harmonic conversion efficiencies may be achieved by the use of varactor diodes as distorting elements in harmonic frequency generators or multipliers, compared with resisistive diodes or the like non-linear or distorting impedances.

Ordinarily, a discrete harmonic frequency of the mixture generated by the multiplier is utilized, being referred to hereinafter as the "useful harmonic" for the purpose of this specification. The undesirable harmonics located between the fundamental frequency and the useful harmonic frequency, as well as those being above the frequency of the useful harmonic, referred to as "idle harmonics" in the following, are at least approximately short-circuited by means of suitable filter circuits effectively shunted across the diode or harmonic generator. As a consequence, all impedances located in the current paths of the various harmonics are transferred in some form or other upon the input circuit of the multiplier by way of the diode acting as a generator, whereby impedance variations in the path of a harmonic result in a corresponding change of the input impedance for the fundamental frequency. As a consequence, an optimum design of the multiplier makes it necessary that the load impedance of the useful harmonic be properly transferred upon the diode and matched with the wave impedance of the feeding line as well as with the effective load resistance of the diode for both the fundamental frequency and the useful harmonic frequency, on the one hand, and that the impedance of the circuit paths of the undesired idle harmonic or harmonics, as viewed from the diode, be at least approximately short-circuited, on the other hand, in such a manner as to prevent any voltage buildup at the respective frequencies across the diode. The latter requirement is of special importance for those idle harmonics which are located between the fundamental frequency and the useful harmonic frequency, that is, the second harmonic in the case of a frequency tripling circuit and the second and third harmonics in the case of a frequency quadrupling circuit, respectively.

The known frequency multipliers utilizing a varactor diode include, in addition to the tuned circuits which serve to separate the fundamental and useful harmonic frequencies and to effect impedance matching with the external circuits, a number of series resonant or acceptor circuits tuned to the idle harmonic frequencies and serving to short-circuit the diode for those frequencies. These acceptor circuits involve a considerable expenditure from a circuit point of view, especially in the case of relatively high frequency multiplication factors. Besides, the individual acceptor circuits affect the frequency band width of the multiplier and require careful retuning when changing from one to another output or operating frequency in order to maintain optimum conversion efficiency.

Accordingly, an important object of the present invention is the provision of an improved harmonic frequency multiplier of the type referred to utilizing a varactor diode or equivalent voltage-responsive capacitor as a distorting reactance, by which the foregoing and related difficulties and shortcomings inherent in the prior art arrangements are substantially overcome or minimized.

A more specific object of the invention is the provision of a harmonic frequency multiplier of the type referred to, wherein the number of reactance elements and tuned circuits required to separate the fundamental and useful harmonic frequencies, on the one hand, and to reduce or suppress the effect of the idle harmonics on the output circuit, on the other hand, is reduced to a minimum, while affording the achievement of optimum conversion efficiency for the useful harmonics selected.

The invention, both as to foregoing and ancillary objects as well as novel aspects thereof, will be better understood from the following detailed description, taken in conjunction with the accompanying drawings forming part of this specification and in which.

Like reference characters denote like parts throughout the different views of the drawings.

With the foregoing objects in view, the invention involves generally the provision, in connection with a capacitative harmonic frequency generator of the type referred to, of an operating and filtering circuit or network connecting the source or generator of the fundamental frequency with the load excited by the useful harmonic frequency via the capacitor or harmonic generator, said circuit being designed and/or adjusted in such a manner as to cause the frequency or frequencies of at least one minimum or zero point of the impedance versus frequency response characteristic of the circuit, as viewed from said capacitor, to at least approximately coincide with the frequency of one or more undesirable or idle harmonics, preferably those located in the vicinity of the fundamental and/or useful harmonic frequencies, respectively. In other words, the invention contemplates the utilization of the component parts or operating circuits of the frequency multiplier network, serving to match the input and output circuits with the harmonic generator and to separate the fundamental and useful harmonic frequencies, to additionally function in reducing or suppressing the effects of the undesirable or idle harmonics, substantially without affecting the optimum conversion efficiency of the multiplier, in a manner as will become further apparent from the following detailed description in reference to the drawings.

While in the following the invention will be described with specific reference to a P–N junction or varactor diode frequency multiplier, it is understood that equivalent voltage-responsive capacitor devices may be employed to achieve the novel results and effects characteristic of the invention.

Figure 1:
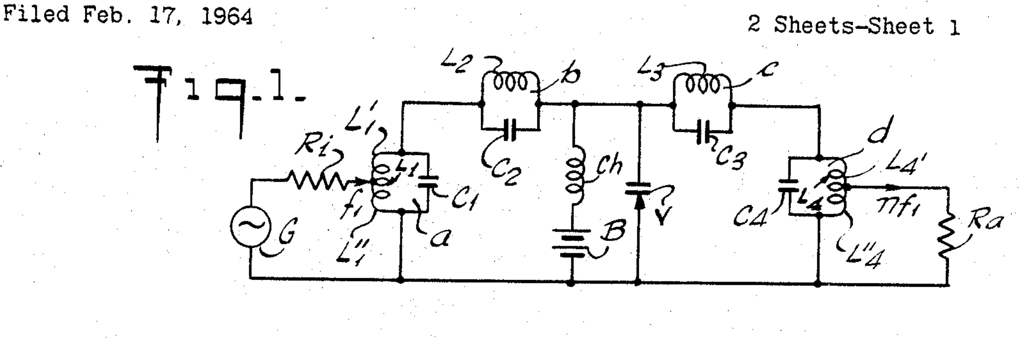
FIG. 1 is a basic circuit diagram of a varactor diode frequency multiplier embodying the principles of the invention.

Referring more particularly to FIG. 1, the reference character G represents a source or generator having an internal resistance $R_i$ and producing or supplying a fundamental frequency $f_1$. $R_a$ represents the output or load resistance, such as an antenna or the like utilization circuit or device, to which is applied the output voltage of the multiplier having a freqeuncy $nf_1$, wherein $n$ denotes the frequency multiplication factor. Connected to the input and to the output of the varactor multiplier or harmonic generator V are the transformer circuits $a$ and $d$ which serve to provide impedance matching with the resistances $R_i$ and $R_a$, respectively. In the example shown, circuit $a$ is a parallel-resonant or rejector circuit being tuned to the fundamental frequency $f_1$ and comprised of a capacity $C_1$ shunted by a tapped inductance $L_1'$, $L_1''$ forming an auto-transformer which connects the generator G with the frequency multiplier V. Similarly, the output circuit $d$ is a parallel resonant or rejector circuit being tuned to the frequency $nf_1$ of the useful harmonic and comprised of a capacity $C_4$ and a tapped inductance $L_4'$, $L_4''$ forming an auto-transformer connecting the multiplier V with the load $R_a$.

Connected in parallel to both the circuits $a$ and $d$ is the varactor diode V or equivalent voltage-responsive capacitor being suitably biased by a battery B or the like direct current source which may be protected from the high frequency currents by a choke $Ch$, in a manner well known and understood. The varactor diode V is connected to the input circuit $a$ by way of a first filter circuit $b$, on the one hand, and to the output circuit $d$ by way of a further filter circuit $c$, on the other hand, both said filter circuits being in the form, in the example shown, of parallel-resonant or rejector circuits comprised of capacitors $C_2$ and $C_3$ and inductances $L_2$ and $L_3$, respectively. More particularly, the circuit $c$ being tuned to the fundamental frequency $f_1$ has the effect of causing the voltage of frequency $f_1$ to be applied to the varactor diode V only, rather than to the load resistance $R_a$. On the other hand, the circuit $b$ being resonant to the useful harmonic frequency $nf_1$ has the effect of causing the voltage of frequency $nf_1$ being generated by the diode V to be impressed upon the load resistance $R_a$ only, rather than to the resistance $R_i$ of the generator G. As a consequence, $R_i$, as related to the symmetry point of the circuit $a$, is at first transformed with great approximation to a value $$R_1=R_1(1+L_1'/L_1'')^2$$

by the circuit $a$ and then to a low-ohmic resistance $W_a$ of the diode by the circuit $b$ which offers an inductive impedance to the fundamental frequency $f_1$. The resistance $W_a$ is composed of the loss resistance $R_s$ of the diode effective at the frequency $f_1$, on the one hand, and of a working resistance $R_a'$, the latter being in turn composed of the load resistance $R_a$ transferred upon the diode input by the useful harmonic by way of circuits $d$ and $c$, on the one hand, and of the loss resistance $R_s$ of the diode effective at the harmonic frequency $nf_1$, on the other hand. Assuming a conversion loss of say 3 db, the resistance $W_a=3R_s$, or $R_a=2R_s$, which means in other words that the effective diode resistance for $f_1$ and $nf_1$ adsorbs one half of the applied high frequency power.

In order to achieve maximum efficiency of the multiplier, the external circuits of the most pronounced undesirable or idle harmonics, that is, the harmonics located in the vicinity of the fundamental frequency $f_1$ and of the useful harmonic frequency $nf$, should have an ohmic resistance as low as possible.

In accordance with the concept of the present invention, as exemplified by the basic circuit of FIG. 1, the component elements of the circuit are so designed that the minima or zero points of the impedances as viewed from the diode at least approximately coincide with the frequencies of the respective idle harmonics to be suppressed.

More specifically, in the embodiment according to FIG. 1 the circuit $a$ represents a capacitative impedance for the frequencies between the fundamental frequency $f_1$ and the useful harmonic frequency $nf_1$ and the circuit $b$ represents an inductive impedance, while the circuit $c$ offers a capacitative impedance and the circuit $d$ offers an inductive impedance to the same frequency range. In other words, the circuit, as viewed from the diode V and considered in reference to the frequency range $f_1$–$nf_1$, includes two series-resonant or acceptor circuits comprised of the effective capacitance of the circuit $a$ and the effective inductance of the circuit $b$, on the one hand, and of the effective capacitance of the circuit $c$ and the effective inductance of the circuit $d$, on the other hand. These effective acceptor circuits, in accordance with the present invention, are tuned, for instance, at least approximately to the frequency of the second (idle) harmonic $2f_1$ and to at least one further idle harmonic produced by the frequency multiplier diode V. As a consequence, the diode is practically short-circuited for the respective idle harmonics. For frequencies above the useful harmonic frequency the circuit $d$ represents a capacitative impedance, thus providing a practical short-circuit for all frequencies exceeding the useful harmonic frequency $nf_1$.

Figure 2:
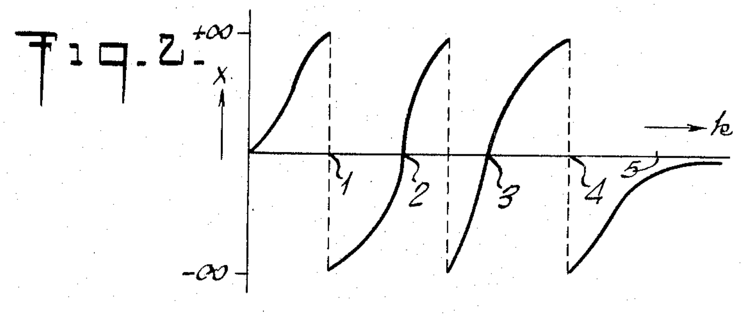
FIGS. 2 and 3 are theoretical diagrams explanatory of the function of FIG. 1.

Let it be assumed, by way of example, that the multiplier, FIG. 1, is designed to quadruple the fundamental frequency $f_1$, that is, having a multiplication factor $n$ equal to 4. In such a case, it is advantageous to tune the effective acceptor circuits $a$, $b$ and $c$, $d$ to the frequencies of the first and second idle harmonics or $2f_1$ and $3f_1$, respectively. FIG. 2 shows the impedance-frequency characteristic of such an arrangement representing the reactance $x$ as measured between the diode terminals as a function of the harmonic number $k$, that is, $k=1$ representing the fundamental frequency, $k=2$ representing the second (idle) harmonic, $k=3$ representing the third (idle) harmonic, and $k=4$ representing the fourth (useful) harmonic, respectively, in the example illustrated. In the diagram, $k=1$ and $k=4$ coincide, respectively, with the parallel-resonance points for the fundamental and useful harmonics, while $k=2$ and $k=3$ represent the points of zero impedance for the second and third harmonics, respectively. As is seen, there obtains a further parallel resonance effect between $k=2$ and $k=3$.

Assuming the harmonic number of the input acceptor circuit $a$, $b$ to be $k_1$ and the harmonic number of the output acceptor circuit $c$, $d$ to be $k_2$, the following relationship obtains in the case of FIG. 1:

$$C_1/C_2=k_1^2-1/(n^2-k_1^2) \text{ and } C_3/C_4=k_2^2-1/(n^2-k_2^2)$$

wherein $n=4$, $k_1=2$ or 3 and $k_2=3$ or 2 for the case of a frequency quadrupling circuit. In other words, the frequency of the second harmonic (first idle harmonic) may coincide with the zero (resonance) point of either of the effective input or output acceptor circuits. In practice, it is advantageous to choose $k_2=2$, or to have the resonance frequency of the output acceptor circuit *c, d* coincide with the second harmonic or first idle harmonic frequency, in that in this case there exists relatively large frequency difference between the resonance frequency of the acceptor circuits, on the one hand, and between said circuits and the associated input and output circuits, on the other hand.

Assuming the parallel resonance between $k=2$ and $k=3$ to be at a frequency determined by the geometric mean of $k_1$ and $k_2$, the following relationship obtains under such condition:

$$C_4/C_2=k_2/k_1.n^2-k_1^2/(n^2-k_2^2)$$

Instead of utilizing the ratios of the capacities of the tuned circuits, the design or relationship may be expressed by other parameters, such as the ratio of the inductances of the circuits. Other relationships in effecting the resonance adjustments result from the transmission conditions, from impedance matching requirements and band width considerations in reference to both the fundamental and useful harmonic frequencies, making it possible thereby to determine all the circuit parameters. These relationships ordinarily involve a sufficient number of degrees of freedom to enable compliance with the requirement for achieving zero or minimum impedance for definite idle harmonic frequencies.

Figure 3:
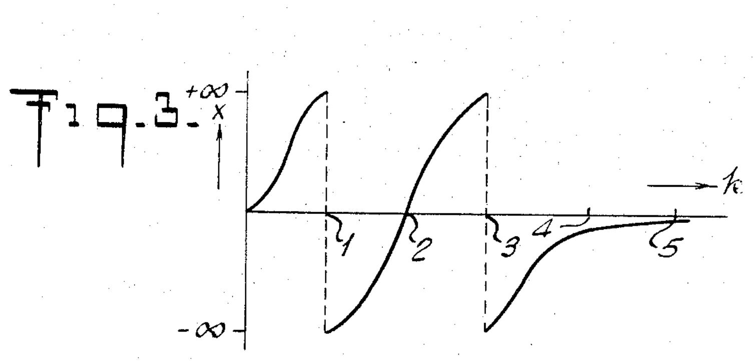

As a further example, let the circuit of FIG. 1 be assumed to be a frequency tripling circuit in which case it is advantageous to have the two zero points of the acceptor circuits *a, b* and *c, d* coincide with one another and with the second harmonic (first idle harmonic), that is $k_1=k_2=2$ as shown by the reactance diagram of FIG. 3.

Figure 4:
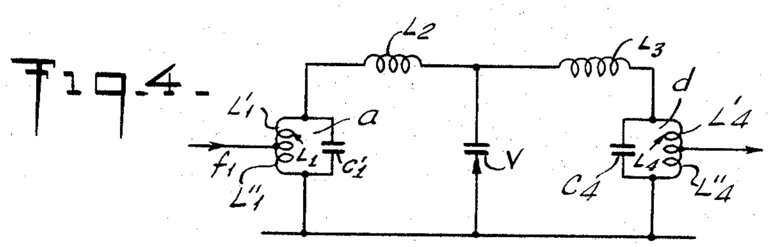
FIG. 4 shows a modification of FIG. 1.
Figure 5:
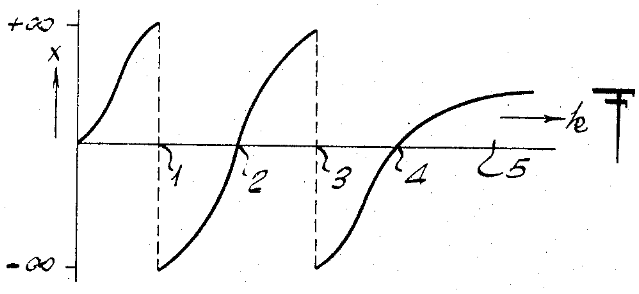
FIG. 5 is a diagram explanatory of the function of FIG. 4.

The basic multiplier circuit according to FIG. 1 may be modified in various manners and simplified as shown for instance by FIG. 4. The latter shows an arrangement wherein capacitors $C_2$ and $C_3$ of the filter circuits *b* and *c* of FIG. 1 are omitted. The input transformer circuit *a* is again composed of the parallel connection of a tapped impedance $L_1$ and capacity $C_1$ and tuned to the fundamental frequency $f_1$ and the output transformer circuit *d* is again composed by a parallel connection of the tapped inductance $L_4$ and capacity $C_4$ and tuned to the useful harmonic frequency $nf_1$. The capacitative diode V is connected with the circuits *a* and *d* through simple inductances $L_2$ and $L_3$, respectively. As viewed from the diode V, the arrangement comprises two parallel-resonant circuits, namely the circuit *a* being tuned to the fundamental frequency $f_1$ and the circuit *d* being tuned to the useful harmonic frequency $nf_1$. Inasmuch as the input circuit *a* represents a capacitative impedance from frequencies above the fundamental frequency $f_1$ it forms a series-resonant or acceptor circuit together with the inductance $L_2$. Similarly, inasmuch as the output circuit *d* represents a capacitative impedance for frequencies above the useful harmonic frequency $nf_1$, it also forms a series-resonant or acceptor circuit together with the inductance $L_3$. In the FIG. 3 modification, it is advantageous to choose the resonance point of the input acceptor circuit to coincide with the second (first idle) harmonic and to choose the resonance point of the output acceptor circuit to coincide with the next higher (idle) harmonic following the useful harmonic frequency. FIG. 5 shows the reactance diagram of a frequency tripler of this type, wherein the circuit elements are so dimensioned as to cause the zero points of the acceptor circuits to coincide with the second and fourth harmonics, respectively.

Figure 6:
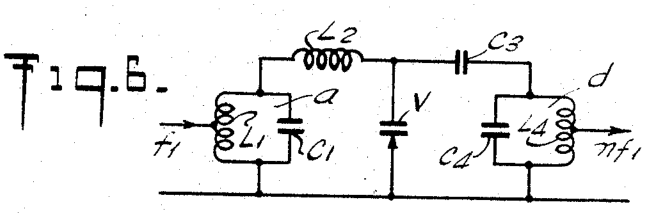
FIG. 6 shows still another modification of FIG. 1.

FIG. 6 shows a further modification of the invention. This circuit is derived from the circuit according to FIG. 1 by making $C_2=0$ and $L_3=\infty$. Since the output circuit *d* presents an inductive impedance for frequencies between $f_1$ and $nf_1$, the resonance point of the acceptor circuit formed by $C_3$ and the effective inductance of the circuit *d* may be designed to coincide with the frequency of an idle harmonic intermediate the fundamental and useful harmonic frequencies. This arrangement is especially suitable in connection with high multiplying factors in which case $L_2$ and $C_3$ provide an especially efficient blocking action for the useful harmonic and fundamental frequencies, respectively.

Figure 7:
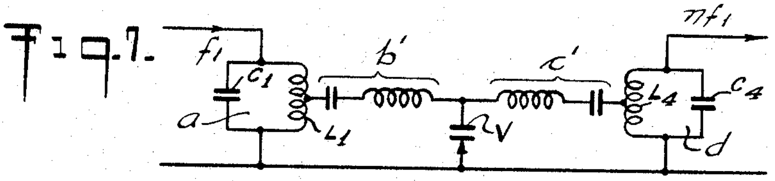
FIGS. 7–9 illustrate further variants of the frequency multiplier circuit forming the subject of the invention.

In place of the parallel-tuned or rejector circuits *b* and *c* of FIG. 1, series-resonant circuits *b'* and *c'* may be used according to a further modification of the invention, as shown by FIG. 7. In the latter, the circuits *a* and *b'* are resonant to the fundamental frequency $f_1$ and the circuits *c'* and *d* are resonant to the useful harmonic frequency $nf_1$. As viewed from the diode V, the arrangement, aside from the highly damped circuits *a* and *d*, includes two acceptor resonances and one parallel resonance. By the proper design of the circuit elements, the series resonances may again be chosen to coincide with the second harmonic (first idle harmonic) and a further idle harmonic frequency, respectively.

Figure 8:
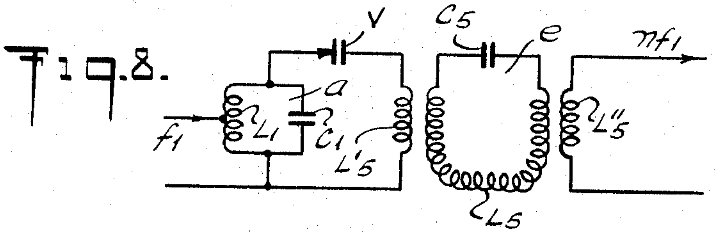

An especially advantageous embodiment of the invention is shown in FIG. 8. The latter comprises a parallel-resonant input or transformer circuit *a* being tuned to the fundamental frequency $f_1$ and an intermediate output or transformer circuit *e* being comprised of a resonant circuit $L_5C_5$ tuned to the useful harmonic frequency $nf_1$ and a pair of primary and secondary coupling windings $L_5'$ and $L_5''$. The diode V is connected in series with the input circuit *a* and the primary $L_5'$ of the intermediate circuit *e*. As viewed from the diode V, the arrangement includes a single series-resonance within the range between the fundamental and useful harmonic frequencies, $f_1$–$nf_1$, namely the resonance of the series-tuned or acceptor circuit formed by the effective capacity of the circuit *a* and the inductance of the primary $L_5'$. Advantageously, this resonance is chosen to coincide with the second harmonic (first idle harmonic) frequency $2f_1$, inasmuch as it has been found sufficient for many cases to provide a zero impedance short-circuiting the diode V limited to the second harmonic or first idle harmonic, respectively, of the fundamental frequency. In the latter case, the multiplier operates at maximum efficiency substantially independently of the harmonic used as output operating frequency.

There is thus provided by FIGS. 1, 4, 6–8 a harmonic frequency multiplier circuit, wherein a reactance (*b*, $L_2$, *b'* and $L_5'$, respectively) is connected in series with a parallel-tuned input coupling circuit *a* resonant to the fundamental frequency, on the one hand, and to a varactor V, on the other hand, with said varactor (FIGS. 1, 4, 6 and 7) or said reactance (FIG. 8) serving as coupling impedances for a parallel-tuned output coupling circuit *d*, *e* resonant to the desired or useful harmonic of said fundamental frequency, and wherein said reactance is designed to combinedly form with said input coupling circuit a series-tuned circuit resonant to an undesired harmonic of said fundamental frequency and short-circuiting said varactor.

Where the output tcircuit is coupled to the varactor (FIGS. 1, 4, 6 and 7), the reactance may be in the form of a decoupling reactance offering high impedance to the useful harmonic frequency, while a further decoupling reactance (*c*, $L_3$, $C_3$, *c'*, respectively) may be connected between the varactor and said output circuit, designed to offer high impedance to the fundamental frequency, on the one hand, and to combinedly form a second series-tuned circuit with said output coupling circuit, on the other hand, also resonant to an undesired harmonic of said fundamental frequency and short-circuiting said varactor.

Figure 9:
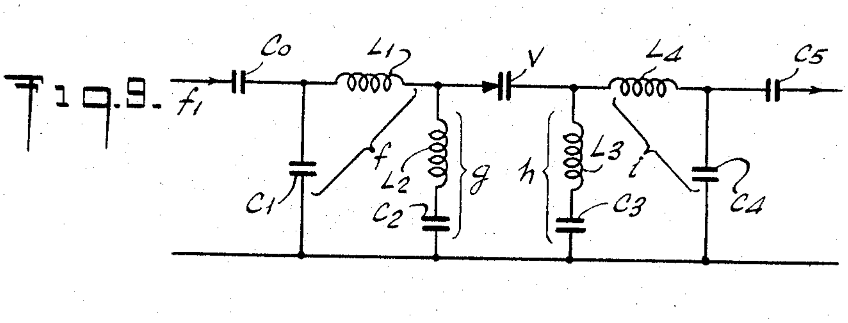

Yet another variant of the frequency multiplier embodying the concept of the invention is obtained by the dual circuit derived from the circuit according to FIG. 1 and shown by FIG. 9, wherein all the acceptor circuits are replaced by rejector circuits and all parallel connections are replaced by series connections, and vice versa, in a manner well understood. FIG. 9 comprises an input transformer or circuit $C_0$, $C_1$, $L_1$ with $C_0$ and $C_1$ representing a capacitative potential divider or coupling circuit, with $C_1$, $L_1$ representing an acceptor circuit $f$ resonant to the fundamental frequency $f_1$, and an output circuit $L_4$, $C_4$, $C_5$ with $C_4$ and $C_5$ representing a capacitative voltage divider and with $L_4$, $C_4$ representing an acceptor circuit $i$ resonant to the useful harmonic frequency $nf_1$. The varactor diode V is connected in series with the input and output coupling circuits $f$ and $i$ each of which is further shunted by a series-tuned or acceptor circuit $g$ and $h$ being resonant, respectively, to the useful harmonic frequency $nf_1$ and to the fundamental frequency $f_1$. As viewed from the diode V, the circuit includes three zero impedances and two intervening states. In accordance with the invention, the circuits $g$ and $h$ are so designed that the effective inductance of the former and the effective capacitance of the latter form a series-tuned or acceptor circuit being resonant to the second idle harmonic and short-circuiting the diode V. Alternately, the circuits $f$ and $g$, on the one hand, and $h$ and $i$, on the other hand, may be designed to form rejector circuits tuned to different idle harmonic frequencies to be suppressed and connected in series with diode V.

The efficiency of a frequency multiplier is determined by the conversion losses involved in the frequency transformation process. These losses in the case of the conventional multipliers amount to a number of db being about equal to the factor of frequency multiplication up to useful harmonic frequencies in the order of $10^4$ megacycles. The losses in the case of relative high multiplication factors may be reduced substantially by the use of a number of multiplication stages being connected in cascade. For the latter reason the conventional multipliers utilize frequency doubling or tripling stages only connected in cascade. In contrast thereto, it has been found in the case of the present invention that the conversion losses in the case of the higher multiplication factors, for instance, factors of 4–6 for a single stage, are hardly greater than those of a frequency doubler circuit. It is possible, therefore, by the use of the present invention, to achieve relatively higher multiplications with a reduced number of cascade stages, or expenditure of parts and circuits, and with the same efficiency, compared with the multiplier systems according to the prior art.

Figure 10:
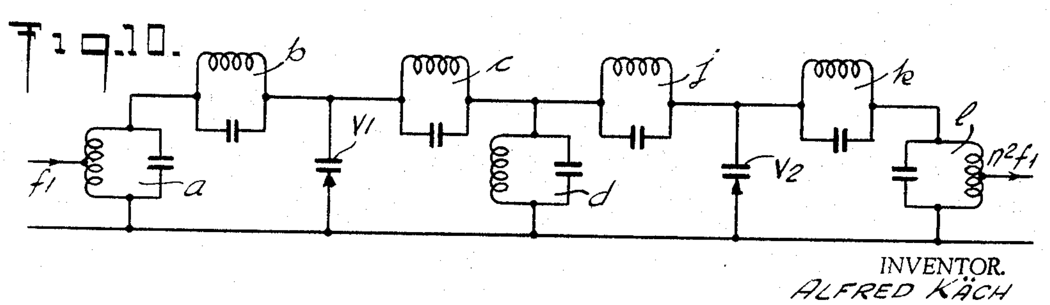
FIG. 10 shows a system comprising two multiplier circuits according to the invention in cascade.

As an example, FIG. 10 illustrates a cascade frequency multiplier according to the invention comprising two multiplying circuits of the general type according to FIG. 1. The first stage comprises the capacitative diode $V_1$, an input circuit $a$ resonant to the fundamental frequency $f_1$, an output circuit $d$ resonant to the useful harmonic frequency $nf_1$, and a pair of rejector circuits $b$ and $c$ resonant to $nf_1$ and $f_1$, respectively, in the manner described hereinbefore. The second stage being connected in a similar manner comprises the capacitative diode $V_2$ with the output circuit $d$ of the first stage forming the input circuit of the second stage. The output circuit $l$ of the second stage is tuned to the frequency $n^2f_1$, representing the useful harmonic frequency, while the rejector circuits $i$ and $j$ are resonant to the frequencies $n^2f_1$ and $nf_1$, respectively, in a manner readily understood from the foregoing.

Assuming each stage to be designed for the quadrupling of the input frequency $f_1$, or resulting in the allover multiplication of $4 \cdot 4 = 16$, it is advantageous to arrange the reactance zero point, as seen from the diodes $V_1$ and $V_2$, at $2f_1$ and $3f_1$ in the first stage, and at $8f_1$ and $12f_1$ in the second stage respectively.

From the foregoing it is seen that the frequency multiplier according to the invention dispenses with the use of special filter circuits for the suppression of the undesirable idle harmonics by the derivation of the necessary series and/or parallel resonance effects, for suppressing the idle harmonics, from the basic operating and filter circuits of the multiplier. This entails the further advantage of eliminating the necessity of adjustments or retuning of the circuits resonant to the idle harmonics when changing from one another input and/or output frequency. The retuning of the main operating circuits automatically results in the proper tuning or adjustment for the idle harmonic frequencies, whereby to involve a minimum of adjustments or control operations. Besides, relatively high multiplication factors may be achieved by the use of the invention with a lesser number of multiplication stages or reduced expenditure of parts and circuit elements and without increased conversion losses compared with conventional multiplier circuits.

In the foregoing the invention has been described in reference to a few specific illustrative arrangements or circuits. It will be evident, however, that variations and modifications, as well as the substitution of equivalent parts and circuits for those shown for illustration may be made in accordance with the broader scope and spirit of the invention, as defined in the appended claims. The specification and drawings are accordingly to be regarded in an illustrative rather than in a restrictive sense.

I claim:

1. A circuit for generating harmonic frequencies comprising in combination:
   (1) a capacitor having a capacitance varying in proportion to a voltage impressed thereon,
   (2) a source of alternating current of fundamental frequency,
   (3) a load impedance,
   (4) input coupling means connecting said source to said capacitor including
      (a) a parallel-tuned input circuit resonant to said fundamental frequency and connected to said source,
      (b) a coupling circuit comprising a reactance and said capacitor in series as coupling impedances and connected to said input circuit,
   (5) output coupling means including
      (a) a parallel-tuned output circuit resonant to a desired harmonic of said fundamental frequency and feeding said load impedance, and
      (b) means coupling said output circuit to one of said coupling impedances,
   (6) said reactance and input coupling circuit designed to combinedly form a series-tuned circuit resonant to an undesired harmonic of said fundamental frequency and short-circuiting said capacitor.

2. In a harmonic generating circuit as claimed in claim 1, said capacitor consisting of a reversely biased junction diode.

3. In a harmonic generating circuit as claimed in claim 1, said output circuit being coupled with said reactance.

4. In a harmonic generating circuit as claimed in claim 1, said output circuit being coupled with said capacitor.

5. In a harmonic generating circuit as claimed in claim 1, said output circuit coupled with said capacitor and said reactance consisting of a parallel-tuned circuit resonant to the frequency of said desired harmonic.

6. In a harmonic generating circuit as claimed in claim 1, said output circuit coupled with said capacitor and said reactance consisting of an inductor.

7. In a harmonic generating circuit as claimed in claim 1, said output circuit coupled with said capacitor and said reactance consisting of a series-tuned circuit resonant to said fundamental frequency.

8. In a harmonic generating circuit as claimed in claim 1, said output circuit coupled with said capacitor, said reactance being designed as decoupling reactance to offer high impedance to said desired harmonic, and a further decoupling reactance connected in series with said output circuit and said capacitor and designed both to offer high impedance to said fundamental frequency and to combinedly form with said output coupling circuit a series-tuned circuit resonant to a further undesired harmonic of said fundamental frequency and short-circuiting said capacitor.

9. In a harmonic generating circuit as claimed in claim 8, said further decoupling reactance consisting of a parellel-tuned circuit resonant to said fundamental frequency.

10. In a harmonic generating circuit as claimed in claim 8, said further decoupling reactance consisting of a series-tuned circuit resonant to said desired harmonic frequency.

11. In a harmonic generating circuit as claimed in claim 8, said further undesired harmonic being above said desired harmonic and said further decoupling reactance consisting of an inductor.

12. In a harmonic generating circuit as claimed in claim 8, said further undesired harmonic being below said desired harmonic and said further decoupling reactance consisting of a capacitor.

References Cited

UNITED STATES PATENTS

| | | | |
|---|---|---|---|
| 1,920,194 | 8/1933 | Gerth | 328—16 |
| 1,925,520 | 9/1933 | Buschbeck | 328—16 |
| 2,013,806 | 9/1935 | Osnos | 328—16 |
| 3,177,378 | 4/1965 | Pulfer et al. | 307—88.5 |

OTHER REFERENCES

1959 International Solid-State Digest (ISSD) of Technical Papers, pages 82–84, "Session VII Solid-State Microwave Electronics II," Feb. 13, 1959.

ARTHUR GAUSS, *Primary Examiner.*

J. S. HEYMAN, *Assistant Examiner.*